(12) United States Patent
Ahn et al.

(10) Patent No.: US 9,224,593 B2
(45) Date of Patent: Dec. 29, 2015

(54) METHOD OF MANUFACTURING A SEMICONDUCTOR DEVICE HAVING A POROUS, LOW-K DIELECTRIC LAYER

(75) Inventors: Sang-Hoon Ahn, Hwaseong-si (KR);
Kyu-Hee Han, Hwaseong-si (KR);
Kyoung-Hee Kim, Incheon (KR);
Gil-Heyun Choi, Seoul (KR);
Byung-Hee Kim, Seoul (KR);
Sang-Don Nam, Seoul (KR)

(73) Assignee: Samsung Electronics Co., Ltd. (KR)

( * ) Notice: Subject to any disclaimer, the term of this patent is extended or adjusted under 35 U.S.C. 154(b) by 293 days.

(21) Appl. No.: 13/242,031

(22) Filed: Sep. 23, 2011

(65) Prior Publication Data
US 2012/0178253 A1 Jul. 12, 2012

(30) Foreign Application Priority Data

Jan. 10, 2011 (KR) ........................ 10-2011-0002407

(51) Int. Cl.
| | |
|---|---|
| H01L 21/768 | (2006.01) |
| H01L 21/312 | (2006.01) |
| C25D 1/08 | (2006.01) |
| H01L 21/02 | (2006.01) |
| C23C 16/40 | (2006.01) |
| C23C 16/56 | (2006.01) |

(52) U.S. Cl.
CPC ........ *H01L 21/02203* (2013.01); *C23C 16/401* (2013.01); *C23C 16/56* (2013.01); *C25D 1/08* (2013.01); *H01L 21/02126* (2013.01); *H01L 21/02216* (2013.01); *H01L 21/02274* (2013.01); *H01L 21/02348* (2013.01); *H01L 21/3121* (2013.01); *H01L 21/7682* (2013.01); *H01L 21/76802* (2013.01); *H01L 2221/1047* (2013.01)

(58) Field of Classification Search
None
See application file for complete search history.

(56) References Cited

U.S. PATENT DOCUMENTS

| | | | |
|---|---|---|---|
| 7,022,864 B2 | 4/2006 | Borovik et al. | |
| 7,229,934 B2 | 6/2007 | Dubois et al. | |
| 7,479,306 B2 | 1/2009 | Edelstein et al. | |
| 7,521,377 B2 | 4/2009 | Gates et al. | |
| 2005/0230834 A1 | 10/2005 | Schmitt et al. | |
| 2006/0165891 A1* | 7/2006 | Edelstein et al. | .......... 427/248.1 |
| 2008/0305258 A1* | 12/2008 | Tsuji | .............. 427/245 |
| 2009/0148964 A1* | 6/2009 | Tsuji et al. | ........................ 438/7 |
| 2009/0181178 A1 | 7/2009 | Edelstein et al. | |
| 2010/0123224 A1 | 5/2010 | Lin et al. | |

OTHER PUBLICATIONS

Iacopi et al, "Short-ranged structural rearrangement and enhancement of mechanical properties of organosilicate glasses induced by ultraviolet radiation," J. Appl. Phys. 99:05351-1 to 05351-7 (2006).
Ryan et al, "Property modifications of nanoporous $p$SiCOH dielectrics to enhance resistance to plasma-induced damage," J. Appl. Phys. 104:094109-1 to 094109-7 (2008).

* cited by examiner

*Primary Examiner* — Shamim Ahmed
*Assistant Examiner* — Bradford Gates
(74) *Attorney, Agent, or Firm* — Myers Bigel Sibley & Sajovec, P.A.

(57) ABSTRACT

The inventive concept provides porous, low-k dielectric materials and methods of manufacturing and using the same. In some embodiments, porous, low-k dielectric materials are manufactured by forming a porogen-containing dielectric layer on a substrate and then removing at least a portion of said porogen from the layer.

5 Claims, 13 Drawing Sheets

METHOD OF MANUFACTURING A SEMICONDUCTOR DEVICE HAVING A POROUS, LOW-K DIELECTRIC LAYER

CROSS-REFERENCE TO RELATED APPLICATION

This application claims priority under 35 U.S.C. §119 to Korean Patent Application No. 10-2011-0002407, filed on Jan. 10, 2011, the disclosure of which is hereby incorporated by reference in its entirety.

FIELD OF THE INVENTION

The inventive concept relates to methods of manufacturing a semiconductor device having a porous, low-k dielectric layer.

BACKGROUND

As semiconductor devices have become more integrated, the gaps between interconnections have decreased and the relative importance of resistive-capacitive delay has increased. There is thus a need for improved insulating layers with reduced capacitance.

The inventive concept provides porous and/or low-k dielectric materials having improved mechanical strength and/or dielectric properties and methods of manufacturing and using the same.

SUMMARY

Exemplary embodiments of the inventive concept provide porous, low-k dielectric materials comprising an Si—O—Si network with an Si—O—Si backbone and one or more carbon bridge structures (i.e., —Si—$(CH_2)_n$—Si—).

Exemplary embodiments of the inventive concept provide methods of manufacturing porous and/or low-k dielectric materials and semiconductor devices comprising a porous and/or low-k dielectric layer.

Exemplary embodiments of the inventive concept provide semiconductor devices comprising a porous and/or low-k dielectric layer.

Exemplary embodiments of the inventive concept provide electronic systems comprising one or more semiconductor devices of the inventive concept.

Porous and/or Low-k Dielectric Materials

In accordance with an aspect of the inventive concept, porous and/or low-k dielectric materials may comprise an Si—O—Si network with an Si—O—Si backbone and one or more carbon bridge structures.

In example embodiments, the porous and/or low-k dielectric materials are derived from an organosilicon precursor represented by Chemical Formula 1

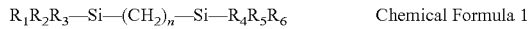   Chemical Formula 1 wherein $R_1$, $R_2$, $R_3$, $R_4$, $R_5$ and $R_6$ each represent a hydrogen, a methyl group ($CH_3$) or an alkoxy group (e.g., a methoxy group ($OCH_3$) or an ethoxy group ($OCH_2CH_3$)) and wherein n represents 1, 2, 3, 4 or 5.

Methods of Manufacturing Porous and/or Low-k Dielectric Materials and Semiconductor Devices In accordance with an aspect of the inventive concept, a method of manufacturing a porous and/or low-k dielectric material and/or a semiconductor device may comprise forming a porogen-containing dielectric layer on a substrate and removing at least a portion of said porogen from said porogen-containing dielectric layer to form a porous and/or low-k dielectric layer.

In example embodiments, forming a porogen-containing dielectric layer on a substrate comprises providing an organosilicon precursor, an oxidant and a porogen and heating the substrate. In some embodiments, providing an organosilicon precursor, an oxidant and a porogen comprises introducing the organosilicon precursor, oxidant and porogen into a deposition chamber containing the substrate such that the oxidant is provided at a flow rate that is less than or equal to 0.7 times that of the organosilicon precursor. In some embodiments, the substrate is heated to a deposition temperature in the range of about 100° C. to about 245° C. (e.g., from 100° C. to less than 245° C.). In some embodiments, the porogen-containing dielectric layer is formed using chemical vapor deposition (CVD), plasma-enhanced chemical vapor deposition method (PECVD) or spin coating.

In example embodiments, removing at least a portion of said porogen from said porogen-containing dielectric layer to form a porous and/or low-k dielectric layer comprises one or more of the following techniques: UV irradiation, e-beam irradiation and thermal treatment.

In example embodiments, the method further comprises forming one or more metal interconnections on the substrate and/or the porous and/or low-k dielectric layer.

Semiconductor Devices

In accordance with an aspect of the inventive concept, a semiconductor device may comprise a porous and/or low-k dielectric layer.

In example embodiments, the porous and/or low-k dielectric layer comprises a porous and/or low-k dielectric material of the inventive concept.

Electronic Systems

In accordance with an aspect of the inventive concept, an electronic system may comprise one or more semiconductor devices having a porous, low-k dielectric layer.

In example embodiments, the electronic systems comprises one or more semiconductor devices of the inventive concept.

BRIEF DESCRIPTION OF THE DRAWINGS

The foregoing and other aspects, features and advantages of the inventive concept will be apparent from the following detailed description of exemplary embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION

Figure 1:
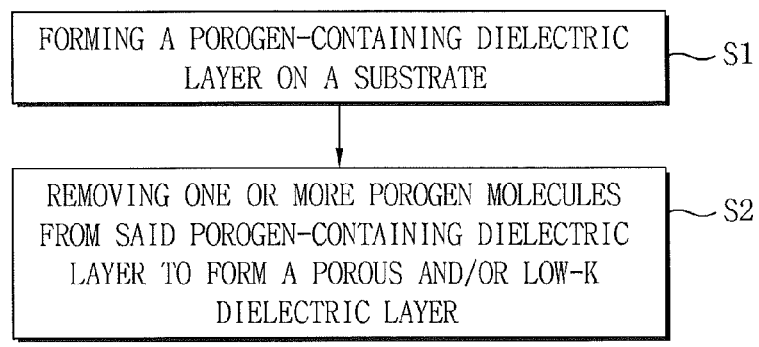
FIG. 1 is a flowchart illustrating a method of forming a porous and/or low-k dielectric layer according to the inventive concept.

Various example embodiments will be described more fully hereinafter with reference to the accompanying drawings, in which some example embodiments are shown. The present inventive concept may, however, may be embodied in many alternate forms and should not be construed as limited to the example embodiments set forth herein. Rather, these example embodiments are provided so that this description will be thorough and complete, and will fully convey the scope of the present inventive concept to those skilled in the art.

In the drawings, the sizes and relative sizes of layers and regions may be exaggerated for clarity. Like numerals refer to like elements throughout. Names and functions of components not shown or not labeled with reference numerals will be easily understood from other drawings and descriptions contained herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms "first," "second," "third," etc. may be used herein to describe various elements, components, regions, layers and/or sections, such elements, components, regions, layers and/or sections are not limited by those terms. The terms are used only to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

The terminology used herein is for the purpose of describing particular embodiments only and is not intended to be limiting of example embodiments.

Unless otherwise defined, all terms used herein (including technical or scientific terms) have the same meanings as those which are generally understood by one of ordinary skill in the art. It will be further understood that, terms, such as those defined in commonly used dictionaries, should be interpreted as having a meaning that is consistent with their meaning in the context of the relevant art and will not be interpreted in an idealized or overly formal sense unless expressly so defined herein.

As used herein, the singular forms "a," "an" and "the" are intended to include the plural forms as well, unless the context clearly indicates otherwise.

As used herein, the terms "comprise," "comprising," "include", "including" and grammatical variants thereof specify the presence of stated features, integers, steps, operations, elements and/or components, but do not preclude the presence or addition of one or more other features, integers, steps, operations, elements, components and/or groups thereof.

As used herein, the term "deposition temperature" refers to the temperature to which a substrate is heated during a deposition process wherein a porogen-containing dielectric layer is formed on said substrate.

As used herein, the term "organosilicon precursor" refers to an organic molecule comprising one or more carbon-silicon bonds. Organosilicon precursors of the inventive concept include, but are not limited to, compounds represented by Chemical Formula 1

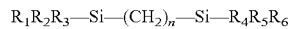
    $R_1R_2R_3$—Si—$(CH_2)_n$—Si—$R_4R_5R_6$    Chemical Formula 1 wherein $R_1$, $R_2$, $R_3$, $R_4$, $R_5$ and $R_6$ each represent a hydrogen, a methyl group ($CH_3$) or an alkoxy group (e.g., a methoxy group ($OCH_3$) or an ethoxy group ($OCH_2CH_3$)) and wherein n represents 1, 2, 3, 4 or 5. In some embodiments, the organosilicon precursor is represented by Chemical Formula 2, Chemical Formula 3, Chemical Formula 4, Chemical Formula 5, Chemical Formula 6, Chemical Formula 7, Chemical Formula 8, Chemical Formula 9, Chemical Formula 10, Chemical Formula 11, Chemical Formula 12, Chemical Formula 13, Chemical Formula 14 or Chemical Formula 15

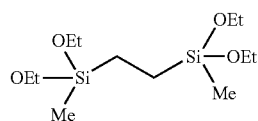

Chemical Formula 1

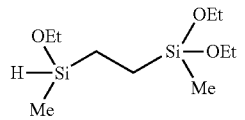

Chemical Formula 2

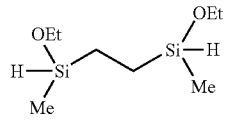

Chemical Formula 3

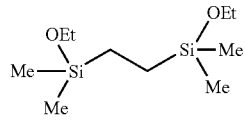

Chemical Formula 4

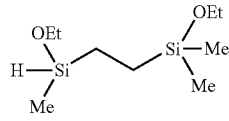

Chemical Formula 5

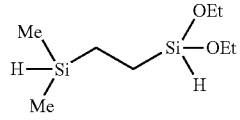

Chemical Formula 6

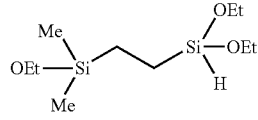

Chemical Formula 7

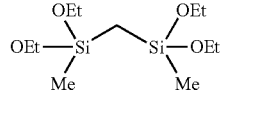

Chemical Formula 8

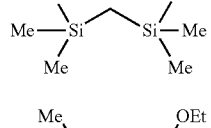

Chemical Formula 9

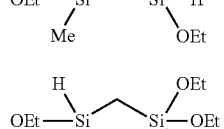

Chemical Formula 10

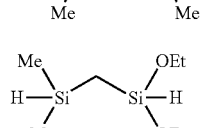

Chemical Formula 11

Chemical Formula 12

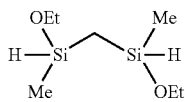

Chemical Formula 13

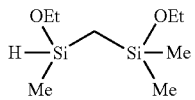

Chemical Formula 14

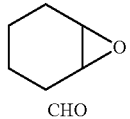

Chemical Formula 15 wherein Me represents a methyl group ($CH_3$) and OEt represents an alkoxy group (e.g., a methoxy group ($OCH_3$) or an ethoxy group ($OCH_2CH_3$)).

As used herein, the term "porogen" refers to a molecule that may be included in a dielectric layer and subsequently removed to form a pore in said dielectric layer. Porogens of the inventive concept include, but are not limited to, branched poly(p-xylene), linear poly(p-phenylene), linear polybutadiene, branched polyethylene, poly(ethylene terephthalate) (PET), polyamide-6,6 (nylon 6/6), syndiotactic polystyrene (PS-syn), polycaprolactone (PCL), poly(propylene oxide) (PPO), polycarbonates, poly(phenylene sulfide) (PPS), polyamideimide (PAI), polyphthalamide (PPA), polymethylstyrene (PMS), polyetheretherketone (PEEK), poly(ether sulfone) (PES), poly(etherketone) (PEK), polyoxymethylene (POM), polybutylene terephthalate (PBT), polystyrene (PS), poly(norbornene), cetyltrimethylammonium bromide (CTAB), poly(ethylene oxide-b-propylene oxide-b-ethylene oxide) (PEO-b-PPO-b-PEO) and cyclodextrin (CD). In some embodiments, the porogen is a hydrocarbon having a structure of CHx-CHy (where both x and y are larger than 0) or a hydrocarbon-like material represented by Chemical Formula 16, Chemical Formula 17, Chemical Formula 18, Chemical Formula 19, Chemical Formula 20, Chemical Formula 21 or Chemical Formula 22:

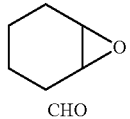

CHO

Chemical Formula 16

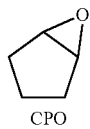

CPO

Chemical Formula 17

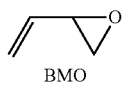

BMO

Chemical Formula 18

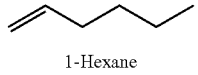

1-Hexane

Chemical Formula 19

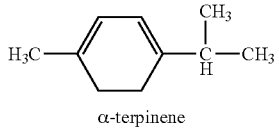

α-terpinene

Chemical Formula 20

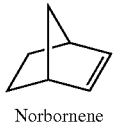

Norbornene

Chemical Formula 21

Norbornadiene/
Bicyclo-
hexadiene
(BCHD)

Chemical Formula 22

The porogen may be present in the dielectric layer as one or more substituents of an organosilicon precursor or as a separate compound from the organosilicon precursor.

As used herein, the term "porous" refers to a material comprising one or more pores. In some embodiments, the pore(s) is/are formed upon removal of a porogen from said material.

Hereinafter, example embodiments of the inventive concept will be explained in detail, with reference to the accompanying drawings.

Porous and/or Low-k Dielectric Materials

Porous and/or low-k dielectric materials of the inventive concept may comprise an Si—O—Si network with an Si—O—Si backbone and one or more carbon bridge structures (i.e., —Si—$(CH_2)_n$—Si—) (with each carbon atom involved in a carbon bridge referred to as a "bridging carbon"). The number of silicon atoms in the Si—O—Si network is not limited. Silicon atoms, other than those binding to a bridging carbon, may independently bind to —$CH_3$ or —O. The structure of the Si—O—Si network may be amorphous and/or may comprise a structure in which one or more Si—O—Si networks (or structures similar thereto) are three-dimensionally repeated and connected to each other.

Porous and/or low-k dielectric materials may be derived from any suitable materials. In some embodiments, the porous and/or low-k dielectric material is derived from an organosilicon precursor represented by Chemical Formula 1, wherein R1, R2, R3, R4, R5 and R6 each represent a hydrogen, a methyl group ($CH_3$) or an alkoxy group (e.g., a methoxy group ($OCH_3$) or an ethoxy group ($OCH_2CH_3$)) and wherein n represents 1, 2, 3, 4 or 5. For example, porous, low-k dielectric materials of the inventive concept may be derived from an organosilicon precursor represented by Chemical Formula 11.

Porous and/or low-k dielectric materials of the inventive concept may be formed using any suitable method. In some embodiments, porous and/or low-k dielectric materials of the inventive concept are formed according to the methods described herein.

Figure 2A:
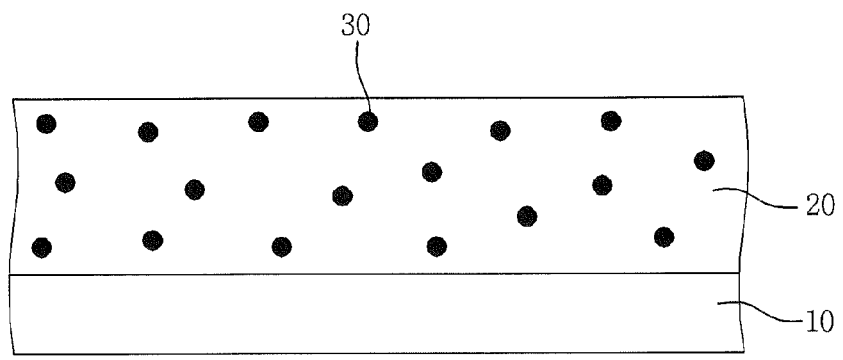
FIGS. 2A and 2B are cross-sectional views illustrating a method of forming a porous porous and/or low-k dielectric layer according to the inventive concept.
Figure 2B:
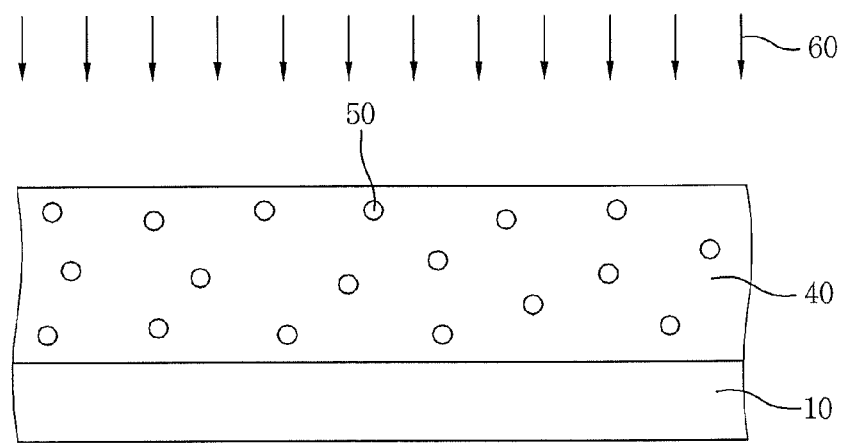

Methods of Manufacturing Porous, Low-k Dielectric Materials and Semiconductor Devices As shown in FIGS. 1 and 2A-2B, a method of manufacturing a porous and/or low-k dielectric material and/or semiconductor device may comprise (S1) forming a porogen-containing dielectric layer 20 on a substrate 10 and (S2) removing one or more porogen molecules 30 from said porogen-containing dielectric layer 20 to form a porous and/or low-k dielectric layer 40.

The substrate 10 may be rigid or flexible and may comprise any suitable material, including, but not limited to, Si, Ge, SiGe, GaP, GaAs, SiC, SiGeC, InAs, InP, a silicon-on-insulator (SOI) substrate, a quartz substrate, a glass substrate, polyimide, PET, polyethylene naphthalate (PEN), poly methyl methacrylate (PMMA), polycarbonate (PC), PES, polyester and combinations thereof. Unless otherwise defined, the substrate 10 may be understood as a silicon wafer or a material layer on the silicon wafer throughout the specification.

The porogen-containing dielectric layer 20 may comprise a low-k dielectric material (i.e., a material having a dielectric constant that is less than that of a basic oxide- or nitrogen-based material (e.g., silicon dioxide)). For example, the porogen-containing dielectric layer 20 may comprise SiOCH, SiOC or SiOF and one or more porogen molecules 30 (e.g., multiple molecules of a single porogen or one or more molecules each of two distinct porogens).

The porogen-containing dielectric layer 20 may be formed directly on the substrate 10 or one or more intervening layers may lie between the porogen-containing dielectric layer 20 and the substrate 10. For example, a plurality of conductive layers, dielectric layers and/or insulating layers may be formed between the porogen-containing dielectric layer 20 and the substrate 10. However, for clarity, the inventive concept will be described hereinafter as though the porogen-containing dielectric layer 20 is formed directly on the substrate 10.

The porogen-containing dielectric layer 20 may be formed using any suitable process, including, but not limited to, CVD, PECVD and spin coating.

The porogen-containing dielectric layer 20 may be formed by heating the substrate 10 in the presence of an organosilicon precursor, an oxidant and porogen molecules. Any suitable organosilicon precursor may be used, including, but not limited to, an organosilicon precursor represented by any one of Chemical Formulae 1-15. Any suitable oxidant may be used, including, but not limited to, $O_2$, $O_3$, $N_2O$, $CO_2$ and combinations thereof. Any suitable porogen molecules may be used, including, but not limited to, hydrocarbons having a structure of CHx-CHy (where both x and y are larger than 0), hydrocarbon-like materials represented by Chemical Formulae 16-22 and combinations thereof.

In some embodiments, the organosilicon precursor, oxidant and porogen molecules are introduced into a deposition chamber containing the substrate such that the oxidant is provided at a flow rate that is less than or equal to 0.7 times that of the organosilicon precursor. In some embodiments, the deposition temperature is from 100° C. to less than 245° C.

Porogen molecules 30 may be uniformly or nonuniformly distributed throughout the porogen-containing dielectric layer 20.

Porogen molecules 30 may be removed from the porogen-containing dielectric layer 20 using any suitable curing process, including, but not limited to, UV irradiation, e-beam irradiation, thermal treatments and combinations thereof. For example, as shown in FIGS. 2A-2B, UV irradiation 60 may be used to remove porogen molecules 30 from the porogen-containing dielectric layer 20 to form pores 50, thereby converting the porogen-containing dielectric layer 20 into a porous, low-k dielectric layer 40. One skilled in the art will understand how to select appropriate parameters (wavelength of UV radiation, e-beam intensity, etc.) to allow for partial/complete removal of porogen from the porogen-containing dielectric layer 20 without unnecessarily degrading other characteristics of the layer (mechanical strength, plasma resistance, etc.). For example, when the porogen molecules 30 are hydrocarbons having a structure of $CH_x$-$CH_y$ (where both x and y are larger than 0), the curing process may comprise UV irradiation 60 using wavelength of UV ray having 200 nm or more.

The porous and/or low-k dielectric layer 40 may have a lower dielectric constant than the porogen-containing dielectric layer 20 from which it is derived (e.g., because pores formed by the removal of porogen molecules decrease the permittivity of the layer). In some embodiments, the porous and/or low-k dielectric layer 40 has a dielectric constant in a range of about 1 to about 2.5. For example, a porous, low-k dielectric layer may have a dielectric constant between 1 and 2.5.

The porogen-containing dielectric layer 20 and the porous and/or low-k dielectric layer 40 may comprise an Si—O—Si network with an Si—O—Si backbone and one or more carbon bridge structures (i.e., —Si—$(CH_2)_n$—Si—) (with each carbon atom involved in a carbon bridge referred to as a "bridging carbon"). Bridging carbons may increase the mechanical strength and/or plasma resistance of the Si—O—Si network. The number of silicon atoms in the Si—O—Si network is not limited. Silicon atoms, other than those binding to a bridging carbon, may independently bind to —$CH_3$ or —O. The structure of the Si—O—Si network may be amorphous and/or may comprise a structure in which one or more Si—O—Si networks (or structures similar thereto) are three-dimensionally repeated and connected to each other.

Figure 3A:
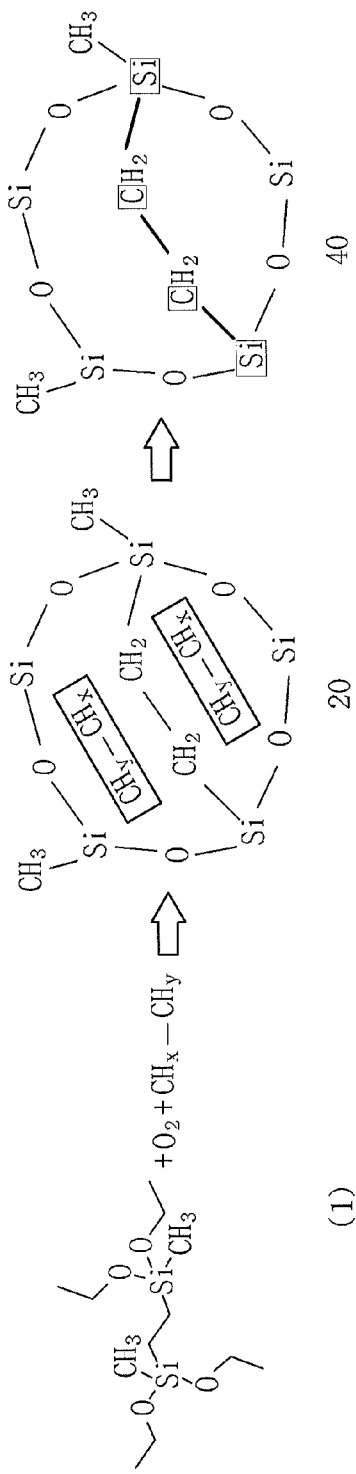
FIGS. 3A to 3B are schematic views illustrating a process of forming a porous and/or low-k dielectric layer according to the inventive concept.
Figure 3B:
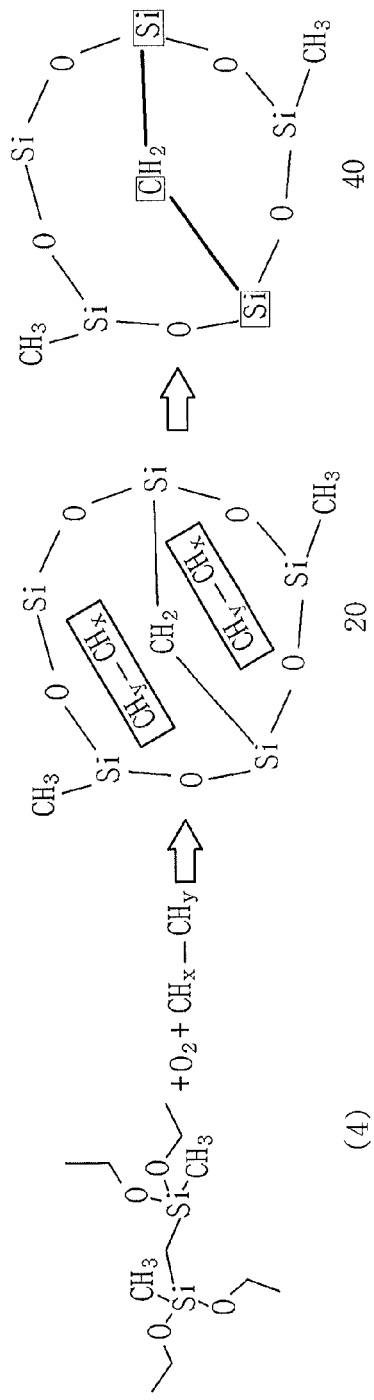

For example, as shown in FIGS. 3A-3B, an organosilicon precursor represented by Chemical Formula 2 (bismethyldiethoxysilyl ethane; FIG. 3A) or Chemical Formula 9 (bismethyldiethoxysilyl methane; FIG. 3B), an oxidant ($O_2$) and porogen molecules ($CH_x$-$CH_y$) may be used to form a porogen-containing dielectric layer 20 comprising an Si—O—Si network having Si—$(CH_2)_2$—Si (FIG. 3A) or Si—$(CH_2)$—Si (FIG. 3A) carbon bridge structures, respectively. Porogen molecules ($CH_x$-$CH_y$) may be uniformly interspersed within the Si—O—Si network of the porogen-containing dielectric layer 20. Upon removal of the porogen molecules, the porous and/or low-k dielectric layer 40 may retain the aforementioned Si—O—Si network.

Carbon atoms present in the Si—O—Si network of the porous and/or low-k dielectric layer 40 are present in a form of a methyl (—$CH_3$) group binding to a Si atom or in the form a bridging carbon. As indicated above, bridging carbons may increase the mechanical strength and/or plasma resistance of the porous and/or low-k dielectric layer.

Furthermore, since bridging carbons are derived from the organosilicon precursor(s) used to form the porogen-containing dielectric layer 20 and the porous and/or low-k dielectric layer 40, the characteristics of the layers (e.g., mechanical strength and/or plasma resistance) may be adjusted by selecting suitable organosilicon precursors. For example, as the size of the Si—O—Si network increases, both the permittivity and the mechanical strength of the layer decrease, whereas decreasing the size of the Si—O—Si network increases the mechanical strength and permittivity of the layer. Because the size of the Si—O—Si network depends upon the length of the carbon bridge structure included therein, one may adjust the mechanical strength and permittivity of a layer by selecting an organosilicon precursor that will give rise to a suitable carbon bridge structure (e.g., an organosilicon precursor represented by Chemical Formula 1 wherein n is 1 or 2 may be expected to form a layer whose mechanical strength and permittivity is increased with respect to a layer formed using an organosilicon precursor represented by Chemical Formula 1 wherein n is 5 or 6).

Silicon atoms present in the Si—O—Si network of the porogen-containing dielectric layer 20 and the porous and/or low-k dielectric layer 40 may be bound to one or more methyl groups. Because such methyl groups are hydrophobic and are hard to replace with oxygen, they may decrease the absorption of moisture into the porogen-containing dielectric layer 20 and the porous and/or low-k dielectric layer 40 (e.g., during a curing, ashing or chemical mechanical polishing (CMP) process). Moisture may be absorbed into a pore generated after a porogen molecule is removed by directly binding to the pore using a van der waal's force, thereby increasing the permittivity of and/or altering the mechanical characteristics of the porous and/or low-k dielectric layer 40. Methyl groups in the Si—O—Si network may prevent such increases and/or alterations by preventing the absorption of moisture into the porous porous and/or low-k dielectric layer 40. In some embodiments, the ratio of bridging carbons to methyl groups in the porous and/or low-k dielectric layer 40 is between about 0.5:1 and about 3:1 (e.g., between 0.5:1 and 3:1).

While increasing the number of methyl groups included in the Si—O—Si network may help to prevent the absorption of moisture into the porogen-containing dielectric layer 20 and the porous and/or low-k dielectric layer 40, it may also decrease the mechanical strength of the layers.

As shown in Table 1, Si—C bonds are generally weaker than Si—O bonds, indicating that the strength of an Si—O—Si network may be increased by increasing the ratio of Si—O bonds to Si—C bonds.

TABLE 1

| Bond Energies Associated with Si—O—Si Networks of the Inventive concept | |
|---|---|
| Bond Type | Bond Energy (eV) |
| Si—C (in molecule) | 3.31 |
| Si—C (in solid) | 4.7 |
| Si—O (in molecule) | 4.8 |
| Si—O (in solid) | 8.3 |
| C—C | 3.49 |

Figure 4A:
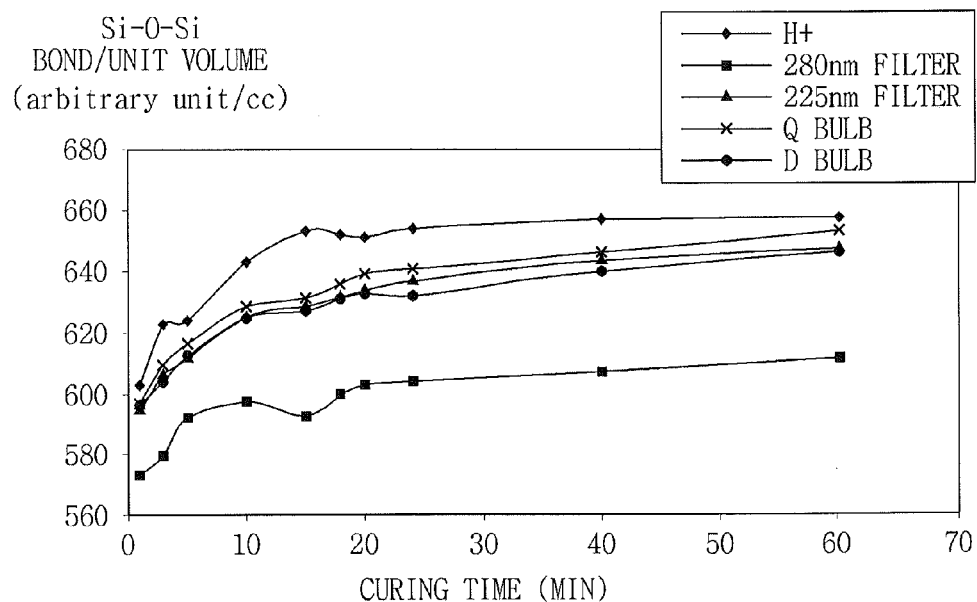
FIGS. 4A and 4B are graphs illustrating relationships between irradiation time of a UV ray and an amount of Si—O—Si bonds in a porous, low-k dielectric layer and between an amount of Si—CH$_3$ bonds and a hardness of the low-k dielectric layer.
Figure 4B:
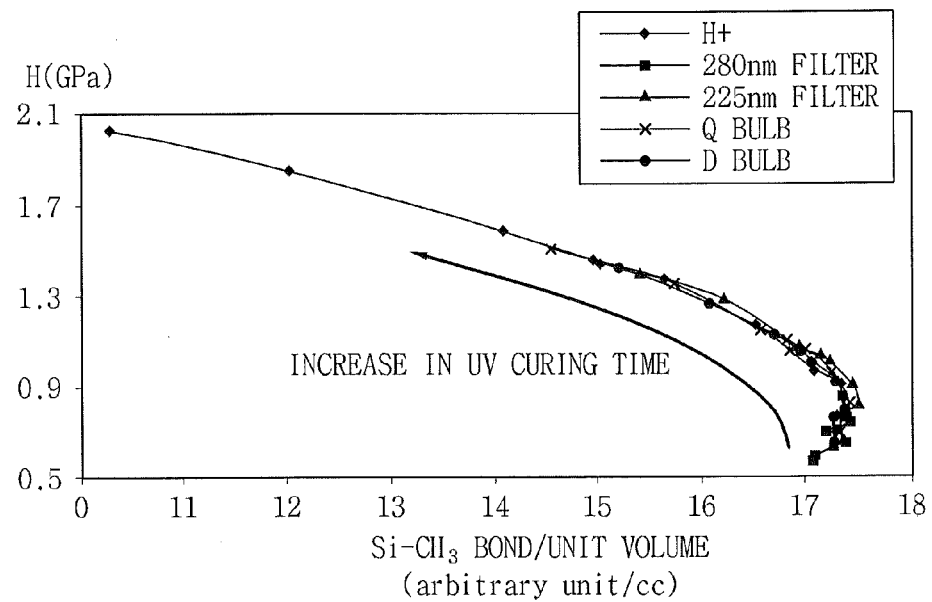

Indeed, as shown in FIGS. 4A-4B, increased UV irradiation leads to a decrease in the number of Si—$CH_3$ bonds in a porous, low-k dielectric layer and an increase in the mechanical strength of the layer. FIG. 4A shows the relationship between irradiation time and the number of the Si—O—Si bonds in a porous, low-k dielectric layer when the porogen molecules were removed using UV rays of various wavelengths (H+: 220 nm or more; 280 nm Filter: 280 nm or more; 225 nm Filter 225 nm or more; Q bulb: 220 or more nm; D bulb: 220 or more nm) and/or visible rays. As shown therein, increasing the irradiation time increased the number of the Si—O—Si bonds in the porous, low-k dielectric layer also increased. FIG. 4B shows the relationship between irradiation time, the number of Si—$CH_3$ bonds in a porous, low-k dielectric layer and the hardness of the porous, low-k dielectric layer when the porogen molecules were removed using UV rays of various wavelengths (H+: 220 nm or more; 280 nm Filter: 280 nm or more; 225 nm Filter 225 nm or more; Q bulb: 220 nm or more; D bulb: 220 nm or more) and/or visible rays. As shown therein, increasing the irradiation time decreased the number of Si—$CH_3$ bonds in the porous, low-k dielectric layer and increased the hardness of the layer.

Deposition Chambers

Figure 5:
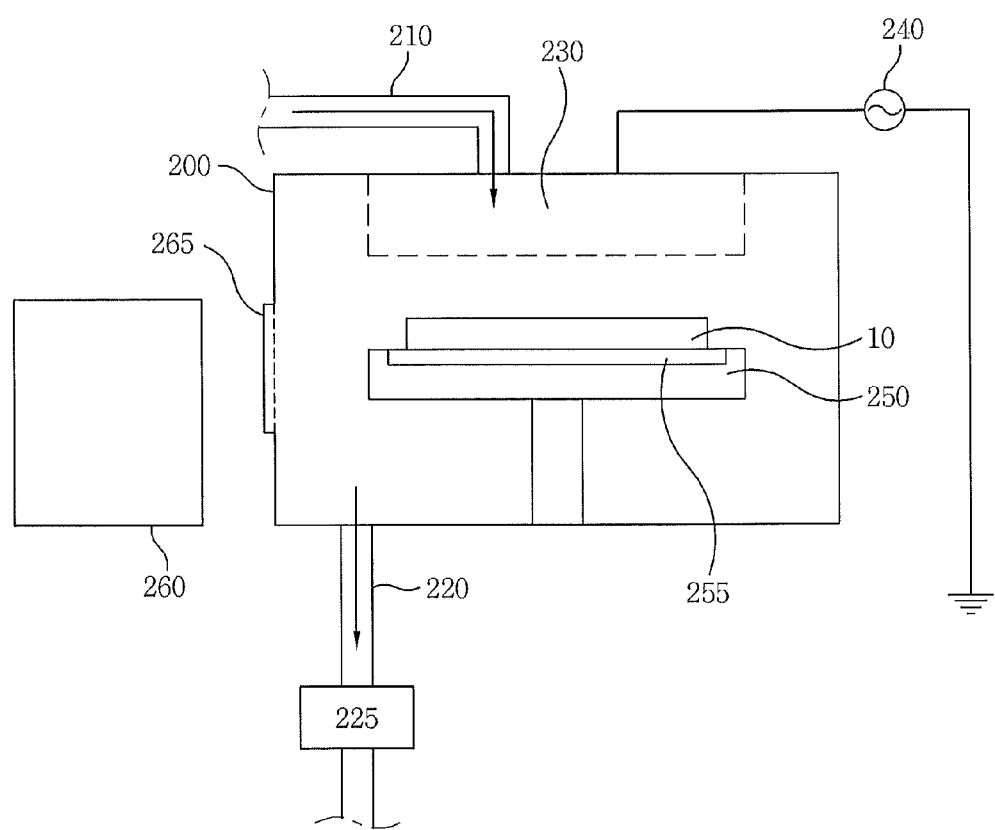
FIG. 5 is a schematic cross-sectional view of a deposition apparatus according to the inventive concept.

As shown in FIG. 5, a deposition chamber 200 (e.g., a PECVD chamber) may be used to form a porogen-containing dielectric layer 20 on a substrate 10.

The deposition chamber 200 may comprise a gas inlet 210 and an exhaust outlet 220.

An organosilicon precursor, an oxidant, and porogen molecules may be introduced into the deposition chamber 200 through the gas inlet 210. In some embodiments, the oxidant is introduced into the chamber at a flow rate that is less than or equal to 0.7 times that of the organosilicon precursor.

The exhaust outlet 220 may be connected with a vacuum pump 225, which may be disposed at the external side of the deposition chamber 200. An air or reaction gas may be exhausted from the deposition chamber 200 by the vacuum pump 225. The vacuum pump 225 may be configured to maintain the pressure of the deposition chamber 200 during the deposition process in a range of about 4 to about 10 Torr (e.g., between 4 and 10 Torr).

The deposition chamber 200 may comprise a door 265 whereby a substrate 10 may be transferred into or out of the deposition chamber 200. A loading/unloading unit 260 capable of loading and unloading a substrate 10 may be disposed at an external side of the deposition chamber 200 (e.g., adjacent to the door 265), and the door 265 may be opened to allow the loading/unloading unit 260 to transfer the substrate 10 into and out of the deposition chamber 200.

The substrate 10 may be placed in the deposition chamber 200 adjacent to a lower electrode 250. The lower electrode 250 may comprise a heater 255, which may itself comprise a heating coil. The substrate 10 may be heated using heat generated by a resistance of the heating coil. The heater 255 of the inventive concept may heat the substrate 10 to a suitable deposition temperature (e.g., in a range of about 100 to about 245° C.).

The deposition chamber 200 may further comprise an upper electrode 230 disposed above and spaced apart from the lower electrode 250 (e.g., there may be a gap of about 200-1000 mm between the upper electrode 230 and the lower electrode 250). The upper electrode 230 may be connected to an RF power source 240, which may provide a high frequency wave. The lower electrode 250 may serve as a susceptor that supports the substrate 10, and plasma may be formed between the upper electrode 230 and the lower electrode 250. For example, plasma maybe formed between the upper electrode 230 and the lower electrode 250 by exciting a reaction gas injected through the gas inlet 210 (e.g., an organosilicon precursor). The lower electrode may be connected with a ground voltage grounding the RF power source 240. The RF plasma power density of the RF power source 240 may be in a range of about 0.7 to about 2.0 W/cm$^2$ (e.g., between 0.7 and 2.0 W/cm$^2$).

The deposition chamber 200 may further comprise a UV irradiation source or e-beam irradiation source, whereby porogen molecules may be removed from a porogen-containing dielectric layer 20 to form a porous and/or low-k dielectric layer 40.

The deposition chamber 200 may further comprise one or more components whereby one or more metal interconnections may be formed on the substrate 10 and/or porous and/or low-k dielectric layer 40.

Deposition Conditions

Figure 6:
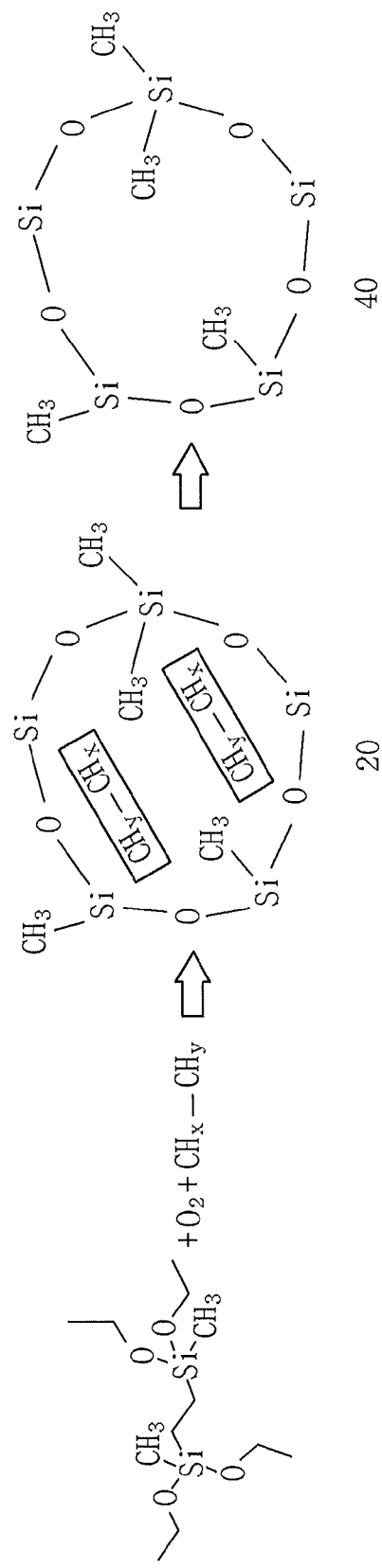
FIG. 6 is a schematic view of a structure of a low-k dielectric layer when it does not follow process conditions of the inventive concept.

As shown in Table 1, the C—C bond energy is approximately 3.49 eV. As a result, the C—C bonds in the carbon bridge structure of a Si—O—Si network are more readily broken than its other bonds. It is therefore quite difficult to form a porogen-containing dielectric layer comprising an Si—O—Si network with an intact carbon bridge structure. If the deposition temperature is 245° C. and/or the flow rate of the oxidant is more than 0.7 times that of the organosilicon precursor, for example, the carbon bridge structure is unlikely to survive the deposition process. Rather than an Si—O—Si network comprising a carbon bridge structure (as shown in FIGS. 3A-3B), such conditions are more likely to result in an Si—O—Si network wherein each of the carbon atoms exists as part of an Si—CH$_3$ bond (as shown in FIG. 6). Because the presence of bridging carbons increases the mechanical strength and/or plasma resistance of the Si—O—Si network, a porogen-containing dielectric layer formed under such conditions may have insufficient mechanical strength and/or plasma resistance.

On the other hand, if the deposition temperature is less than 100° C., a relatively large amount of hydrocarbon may be deposited in the porogen-containing dielectric layer, making it difficult to form pores during curing process (because the pores tend to collapse).

The mechanical characteristics and permittivity of porous, low-k dielectric layers formed using different deposition conditions will be described hereinafter with reference to the following Experimental and Comparative Examples.

EXPERIMENTAL EXAMPLE 1

An organosilicon precursor represented by Chemical Formula 2 (bismethyldiethoxysilyl ethane), an oxidant ($O_2$) and porogen molecules represented by Chemical Formula 20 (α-terpinene) were introduced into a deposition chamber. The pressure in the chamber was 6.75 Torr, and the gap between the upper electrode and the lower electrode was 14 mm. An inert gas (He) was introduced into the deposition chamber at 150 sccms. The oxidant was introduced into the deposition chamber at a flow rate of 25 sccms, and the organosilicon precursor was introduced into the deposition chamber at a flow rate of 480 mg/min. The flow rate of the oxidant, 25 sccms, is approximately 71.43 mg/min, which is approximately 0.15 times the flow rate of the organosilicon precursor. The deposition temperature was 220° C.

Following deposition, a broadband UV ray having a wavelength of 220 nm or more was used to remove porogen molecules from the porogen-containing dielectric layer to form a porous, low-k dielectric layer. The porous, low-k dielectric layer manufactured according to Experimental Example 1 had a modulus of elasticity (E) of 8.5 GPa.

COMPARATIVE EXAMPLE 1

A porous, low-k dielectric layer was formed as described above in Experimental Example 1, except that the deposition temperature was 245° C. The modulus of elasticity (E) of the porous, low-k dielectric layer was 5.0 GPa.

EXPERIMENTAL EXAMPLE 2

Four porous, low-k dielectric layers were formed as described above in Experimental Example 1 (i.e., at a deposition temperature of 220° C.).

EXPERIMENTAL EXAMPLE 3

Four porous, low-k dielectric layers were formed as described above in Experimental Example 1, except that the deposition temperature was 200° C.

COMPARATIVE EXAMPLE 2

Three porous, low-k dielectric layers were formed as described above in Experimental Example 1, except that the deposition temperature was 245° C.

COMPARATIVE EXAMPLE 3

Three porous, low-k dielectric layers were formed as described above in Experimental Example 1, except that the deposition temperature was 260° C.

Figure 7A:
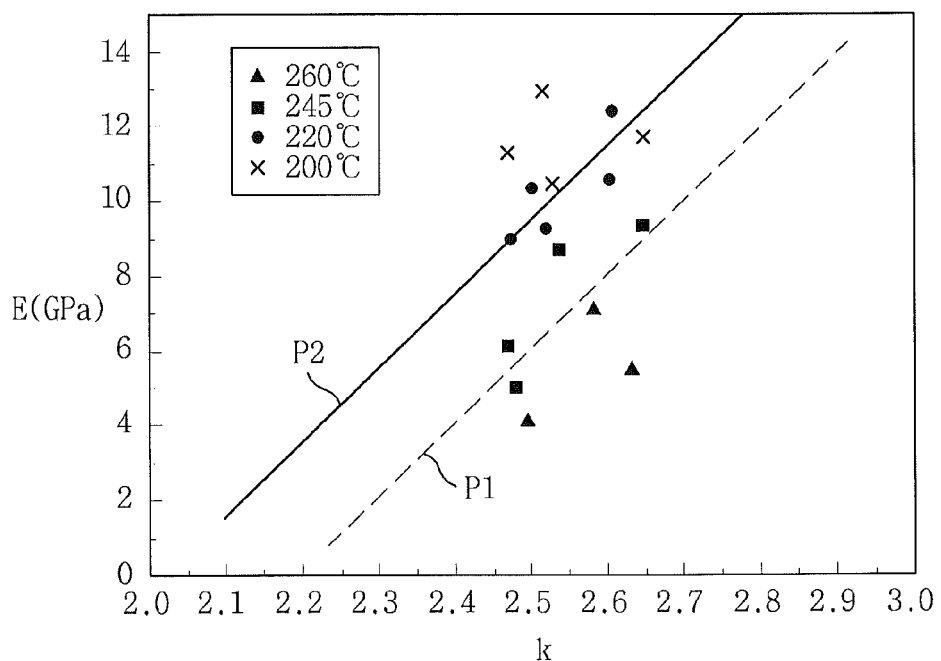
FIGS. 7A to 7C are graphs of modulus of elasticity (E) versus permittivity (k) of a porous, low-k dielectric layer formed at various deposition temperatures.

The modulus of elasticity and permittivity of each porous, low-k dielectric layer described in Experimental Examples 1-3 and Comparative Examples 1-3 is shown in FIG. 7A. As shown therein, decreasing the deposition temperature decreased the permittivity and increased the modulus of elasticity of the porous, low-k dielectric layer. For example, the average predicted curve for the modulus of elasticity and permittivity at a deposition temperature of 220° C. (P2) lies to the left of the average predicted curve for the modulus of elasticity and permittivity at a deposition temperature of 245° C. (P2), indicating that, all other things being equal, a porous, low-k dielectric layer formed using a deposition temperature of 220° C. is expected to have a greater modulus of elasticity and a lower permittivity than a porous, low-k dielectric layer formed using a deposition temperature of 245° C. Because low permittivity and high mechanical strength is predictive of better performance, one would expect a porous, low-k dielectric layer formed using a deposition temperature of 220° C. to outperform a porous, low-k dielectric layer formed using a deposition temperature of 245° C.

EXPERIMENTAL EXAMPLE 4

Two porous, low-k dielectric layers were formed as described above in Experimental Example 1, except that an organosilicon precursor represented by Chemical Formula 9 (bismethyldiethoxysilyl methane) was used.

EXPERIMENTAL EXAMPLE 5

Three porous, low-k dielectric layers were formed as described above in Experimental Example 4, except that the deposition temperature was 200° C.

COMPARATIVE EXAMPLE 4

Four porous, low-k dielectric layers were formed as described above in Experimental Example 4, except that the deposition temperature was 245° C.

COMPARATIVE EXAMPLE 5

Three porous, low-k dielectric layers were formed as described above in Experimental Example 4, except that the deposition temperature was 260° C.

Figure 7B:
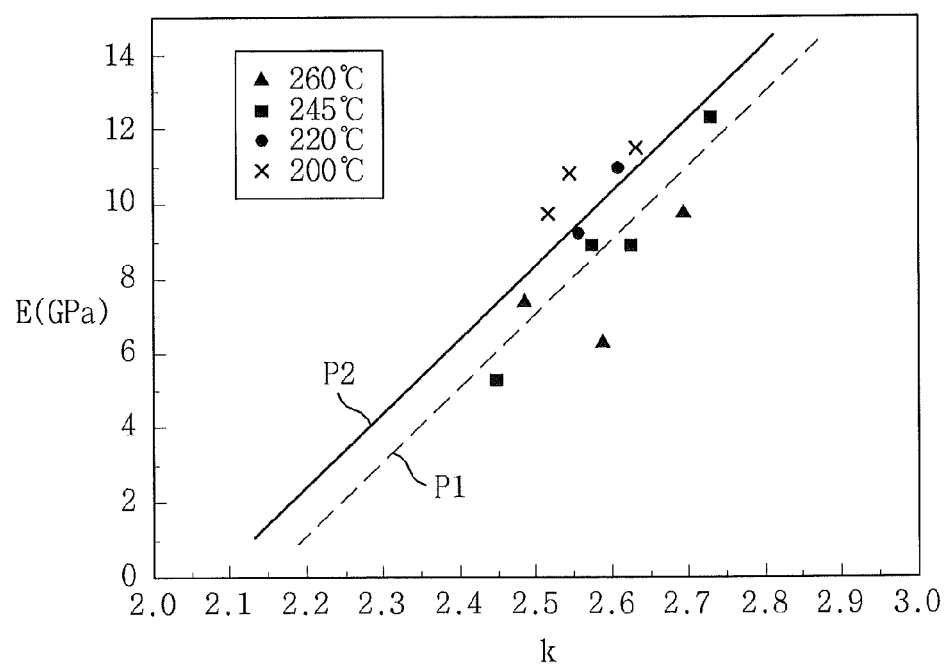

The modulus of elasticity and permittivity of each porous, low-k dielectric layer described in Experimental Examples 4-5 and Comparative Examples 4-5 is shown in FIG. 7B. As shown therein, decreasing the deposition temperature decreased the permittivity and increased the modulus of elasticity of the porous, low-k dielectric layer. For example, the average predicted curve for the modulus of elasticity and permittivity at a deposition temperature of 220° C. (P2) lies to the left of the average predicted curve for the modulus of elasticity and permittivity at a deposition temperature of 245° C. (P2), indicating that, all other things being equal, a porous, low-k dielectric layer formed using a deposition temperature of 220° C. is expected to have a greater modulus of elasticity and a lower permittivity than a porous, low-k dielectric layer formed using a deposition temperature of 245° C. Because low permittivity and high mechanical strength is predictive of better performance, one would expect a porous, low-k dielectric layer formed using a deposition temperature of 220° C. to outperform a porous, low-k dielectric layer formed using a deposition temperature of 245° C.

EXPERIMENTAL EXAMPLE 6

Eight porous, low-k dielectric layers were formed as described above in Experimental Example 1, except that an organosilicon precursor represented by Chemical Formula 11 (where each OEt represents an ethoxy group) was used.

EXPERIMENTAL EXAMPLE 7

Six porous, low-k dielectric layers were formed as described above in Experimental Example 6, except that the deposition temperature was 200° C.

COMPARATIVE EXAMPLE 6

Two porous, low-k dielectric layers were formed as described above in Experimental Example 6, except that the deposition temperature was 245° C.

COMPARATIVE EXAMPLE 7

Nine porous, low-k dielectric layers were formed as described above in Experimental Example 6, except that the deposition temperature was 260° C.

Figure 7C:
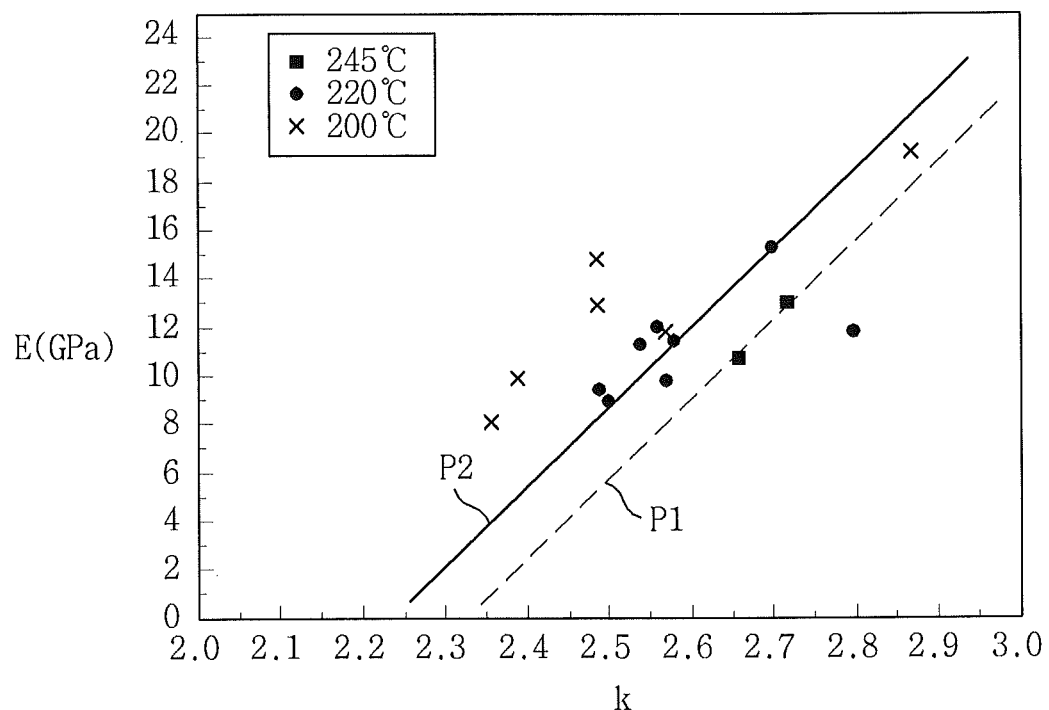

The modulus of elasticity and permittivity of each porous, low-k dielectric layer described in Experimental Examples 6-7 and Comparative Examples 6-7 is shown in FIG. 7C. As shown therein, decreasing the deposition temperature decreased the permittivity and increased the modulus of elasticity of the porous, low-k dielectric layer. For example, the average predicted curve for the modulus of elasticity and permittivity at a deposition temperature of 220° C. (P2) lies to the left of the average predicted curve for the modulus of elasticity and permittivity at a deposition temperature of 245° C. (P2), indicating that, all other things being equal, a porous, low-k dielectric layer formed using a deposition temperature of 220° C. is expected to have a greater modulus of elasticity and a lower permittivity than a porous, low-k dielectric layer formed using a deposition temperature of 245° C. Because low permittivity and high mechanical strength is predictive of better performance, one would expect a porous, low-k dielectric layer formed using a deposition temperature of 220° C. to outperform a porous, low-k dielectric layer formed using a deposition temperature of 245° C.

As shown in FIGS. 7A-7C, when a porous, low-k dielectric layer is formed using an organosilicon precursor represented by Chemical Formula 1 at a deposition temperature less than 245° C., the porous, low-k dielectric layer exhibits excellent mechanical strength and low-dielectric properties. However, if the deposition temperature is less than 100° C., it may be difficult to deposit the dielectric layer using a PECVD method. Thus, in order to form a porous, low-k dielectric layer having excellent mechanical strength and low-dielectric properties, it is preferred that the deposition temperature be 100° C. to less than 245° C.

As shown in FIGS. 7A-7C, when the deposition temperature is 200° C., permittivity of a porous, low-k dielectric layer formed using an organosilicon precursor represented by Chemical Formula 11 (FIG. 7C) may have lower permittivity than a porous, low-k dielectric layer formed using an organosilicon precursor represented by Chemical Formula 2 (bismethyldiethoxysilyl ethane; FIG. 7A) or Chemical Formula 9 (bismethyldiethoxysilyl methane; FIG. 7B). This is because a porous, low-k dielectric layer formed using an organosilicon precursor represented by Chemical Formula 11 (FIG. 7C) includes hydrogen, which helps to increase the porosity of the porous, low-k dielectric layer. For example, the hydrogen may increase the porosity of the porous, low-k dielectric layer by making it easier for porogens to be incorporated into the Si—O—Si network as it forms and/or minimizing the amount of shrinkage that occurs when the porogen molecules are removed. Thus, when an organosilicon precursor represented by Chemical Formula 1 contains one or more hydrogen atoms, the resultant porous, low-k dielectric layer may exhibit high mechanical strength and excellent low dielectric properties.

EXPERIMENTAL EXAMPLE 8

An organosilicon precursor represented by Chemical Formula 11 (where each OEt represents an ethoxy group), an oxidant ($O_2$) and porogen molecules represented by Chemical Formula 20 (α-terpinene) were introduced into a deposition chamber. The pressure in the chamber was 6.75 Torr, and the gap between the upper electrode and the lower electrode was 14 mm. An inert gas (He) was introduced into the deposition chamber at 150 sccms. The oxidant was introduced into the deposition chamber at four different flow rates—0, 90.72, 184.8 and 275.5 sccms—and the organosilicon precursor was introduced into the deposition chamber at a flow rate of 480 mg/min. The flow rate of the oxidant was approximately 0, 0.27, 0.55 and 0.82 times the flow rate of the organosilicon precursor. The deposition temperature was 220° C.

Following deposition, a broadband UV ray having a wavelength of 220 nm or more was used to remove porogen molecules from the porogen-containing dielectric layer to form a porous, low-k dielectric layer. The UV irradiating may be performed at temperature of the substrate between 300 and 450° C. with pressure of the chamber equal to or less than 20 Torr.

Figure 8A:
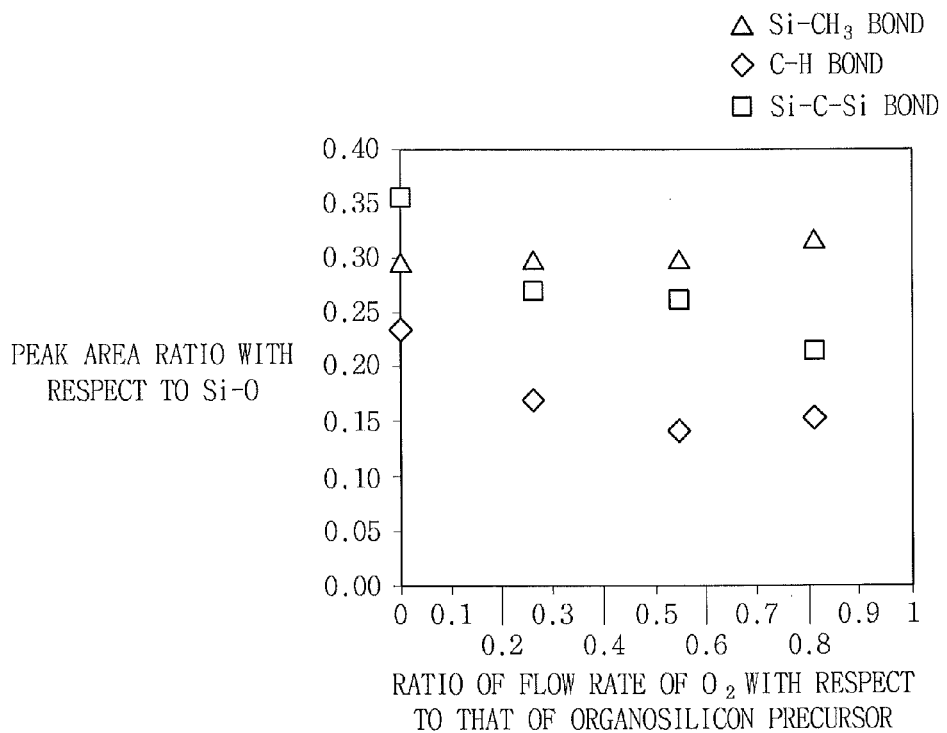
FIGS. 8A and 8B are graphs illustrating characteristics of a porous, low-k dielectric layer according to a flow rate of oxygen.

The peak area ratios of Si—CH3, C—H and Si—C—Si bonds measured using Fourier transform infrared spectroscopy (FTIR) of each porous, low-k dielectric layer described in Experimental Example 8 are shown in FIG. 8A. As shown therein, decreasing the ratio of the oxidant flow rate to the organosilicon precursor flow rate increased the number of C—H and Si—C—Si bonds in the porous, low-k dielectric layer. As discussed above, a bridging carbon bond (Si—C—Si) may increase the mechanical strength of the porous, low-k dielectric layer, an Si—$CH_3$ bond may prevent moisture from being absorbed and adversely affecting the permittivity and plasma resistance of the porous, low-k dielectric layer and a C—H bond may increase the porosity of the porous, low-k dielectric layer. Accordingly, decreasing the ratio of the oxidant flow rate to the organosilicon precursor flow rate may result in the formation of a porous, low-k dielectric layer with superior mechanical strength and low-k dielectric properties.

Figure 8B:
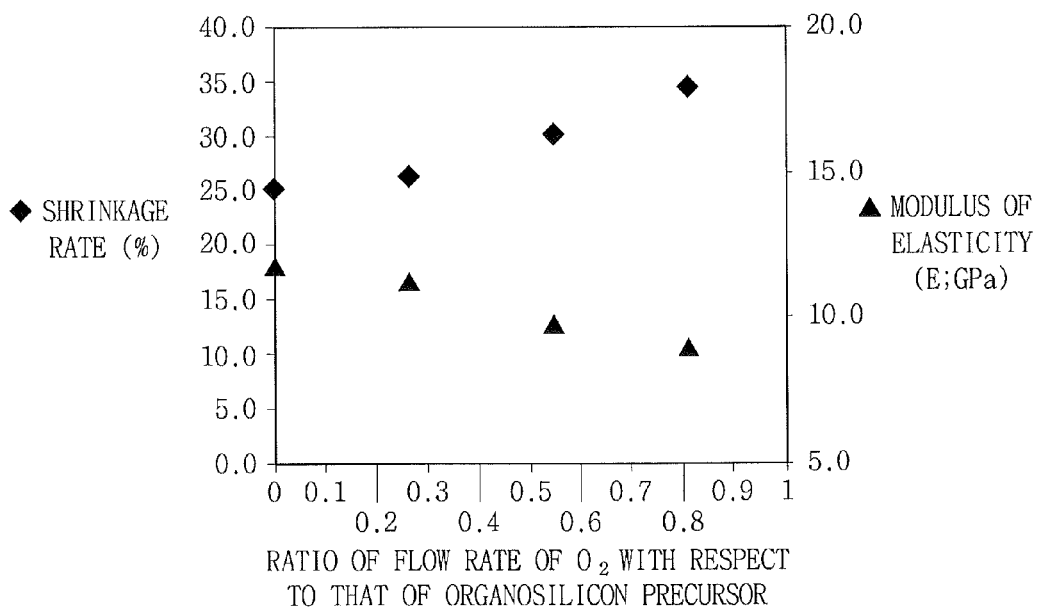

The modulus of elasticity and the shrinkage rate of each porous, low-k dielectric layer described in Experimental Example 8 are shown in FIG. 8B. As shown therein, as the ratio of the oxidant flow rate to the organosilicon precursor flow rate decreases, the modulus of elasticity (E) of the porous, low-k dielectric layer increases and the shrinkage rate of the porous, low-k dielectric layer decreases.

As shown in FIGS. 8A-8B, a porous, low-k dielectric layer may be formed even when no oxidant is provided. Indeed, a porous, low-k dielectric layer formed using an organosilicon precursor of the inventive concept in the absence of an oxidant may exhibit excellent mechanical strength and low-k dielectric properties. Thus, in some embodiments, a porous, low-k dielectric layer is formed in the absence of an oxidant.

EXPERIMENTAL EXAMPLE 9

An organosilicon precursor represented by Chemical Formula 9 (bismethyldiethoxysilyl methane), an oxidant ($O_2$) and porogen molecules represented by Chemical Formula 20 (α-terpinene) were introduced into a deposition chamber. The pressure in the chamber was 6.75 Ton, and the gap between the upper electrode and the lower electrode was 14 mm. An inert gas (He) was introduced into the deposition chamber at 150 sccms. The oxidant was introduced into the deposition chamber at four different flow rates—0, 151.2, 235.2 and 907.2 sccms—and the organosilicon precursor was introduced into the deposition chamber at a flow rate of 480 mg/min. The flow rate of the oxidant was approximately 0, 0.45, 0.7 and 2.7 times the flow rate of the organosilicon precursor. The deposition temperature was 220° C.

Following deposition, a broadband UV ray having a wavelength of 220 nm or more was used to remove porogen molecules from the porogen-containing dielectric layer to form a porous, low-k dielectric layer.

Figure 9A:
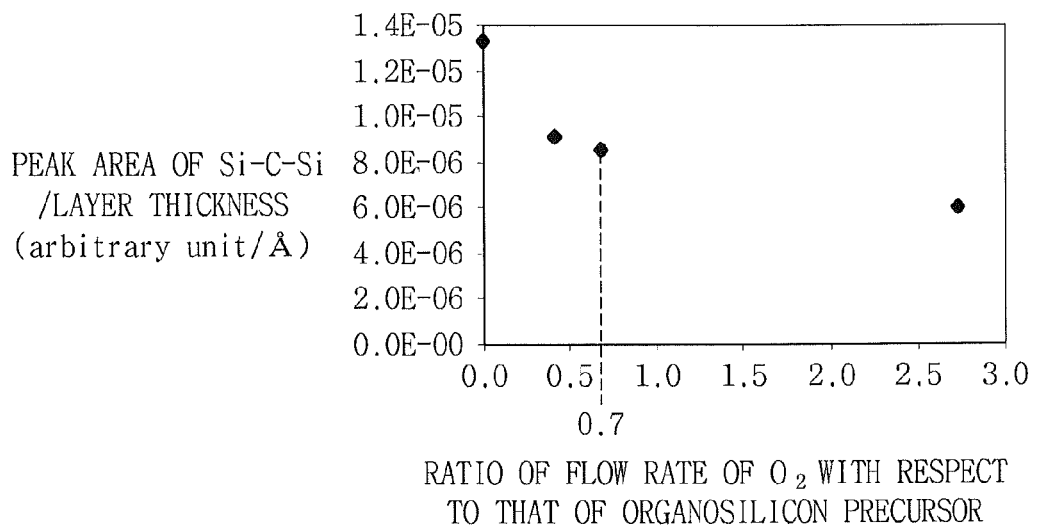
FIGS. 9A and 9B are graphs illustrating characteristics of a porous, low-k dielectric layer according to a flow rate of oxygen.

The relationship between the peak area of the Si—C—Si bond measured using FTIR (which is usually 1360 $cm^{-1}$) over layer thickness and the ratio of the oxidant flow rate to that of the organosilicon precursor for each porous, low-k dielectric layer described in Experimental Example 9 is shown in FIG. 9A. As shown therein, the peak area over thickness of the layers gradually increases as the ratio of the oxidant flow rate to the organosilicon precursor flow rate decreases from 2.7 to 0.7 and dramatically increases as the ratio of the oxidant flow rate to the organosilicon precursor flow rate decreases from 0.7 to 0.

Figure 9B:
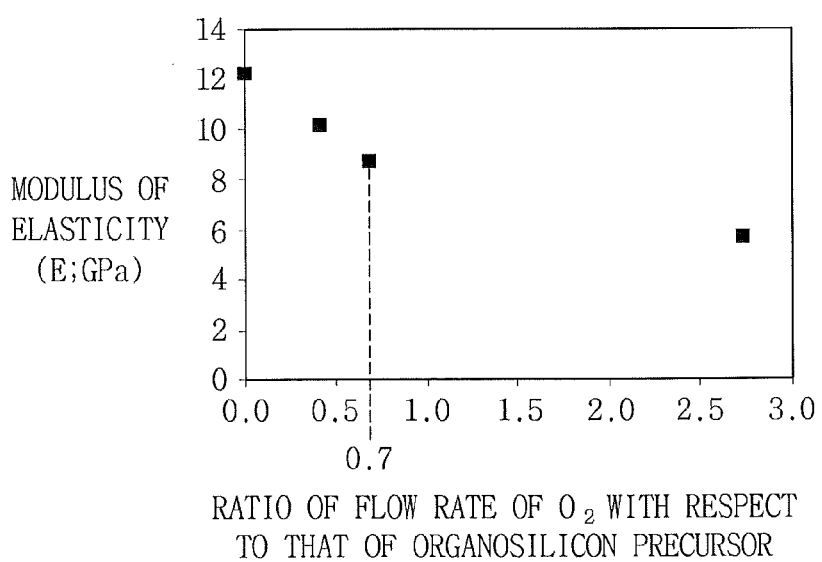

The relationship between the modulus of elasticity and the ratio of the oxidant flow rate to that of the organosilicon precursor for each of the porous, low-k dielectric layers described in Experimental Example 9 is shown in FIG. 9B. As shown therein, the modulus of elasticity gradually increases as the ratio of the oxidant flow rate to the organosilicon precursor flow rate decreases from 2.7 to 0.7 and dramatically increases as the ratio of the oxidant flow rate to the organosilicon precursor flow rate decreases from 0.7 to 0.

As shown in FIGS. 9A-9B, the modulus of elasticity the porous, low-k dielectric layers is directly proportional to the number of bridging carbon bonds included therein. Accordingly, a porous, low-k dielectric layer with superior mechanical strength may be formed using if the ratio of the oxidant flow rate to the organosilicon precursor flow rate is 0 to 0.7.

Metal Interconnections

Methods of manufacturing a semiconductor device according to the inventive concept may further comprise forming one or more metal interconnections.

Figure 10:
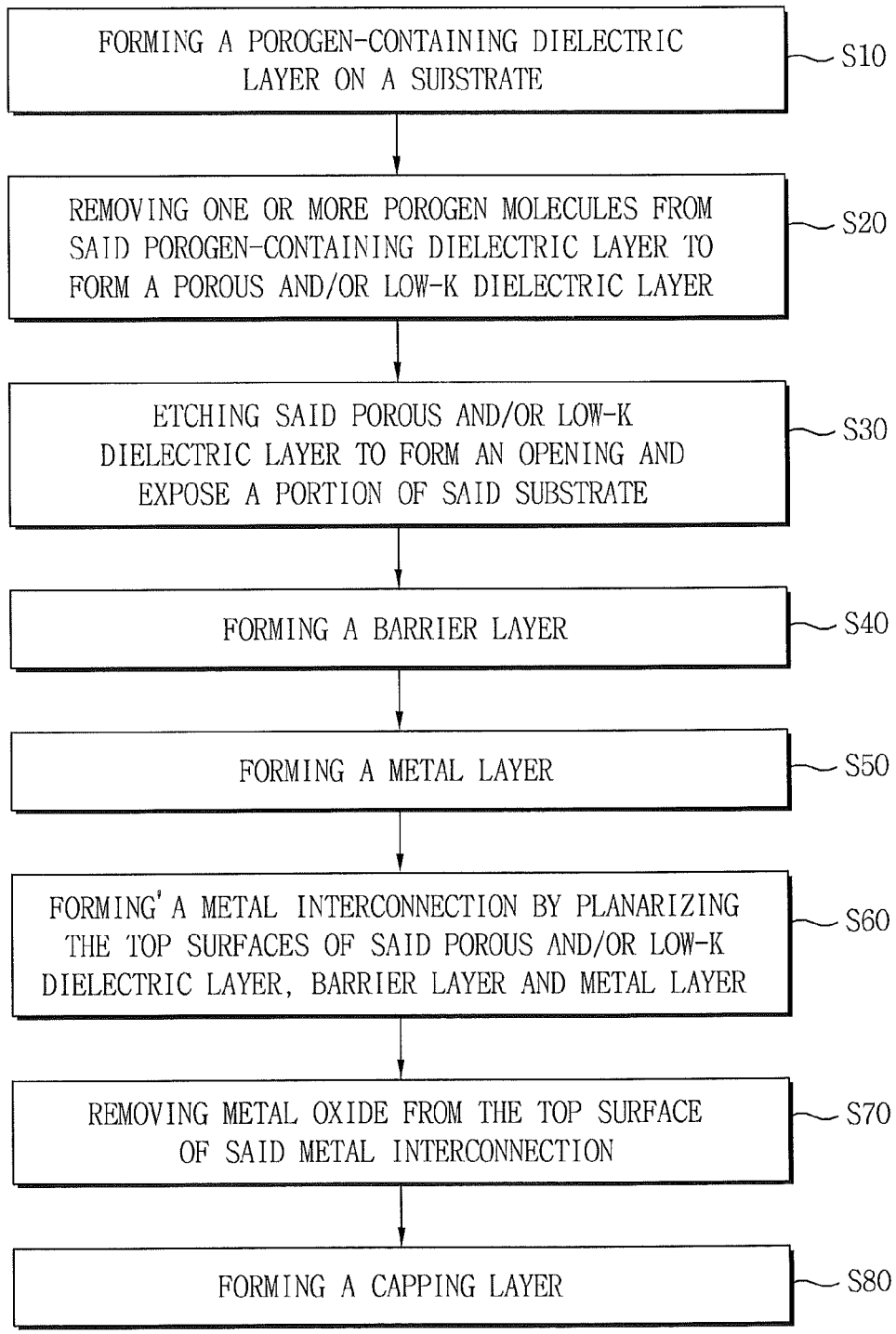
FIG. 10 is a flowchart illustrating a method of manufacturing a semiconductor device using a method of forming a porous and/or low-k dielectric layer according to the inventive concept.
Figure 11A:
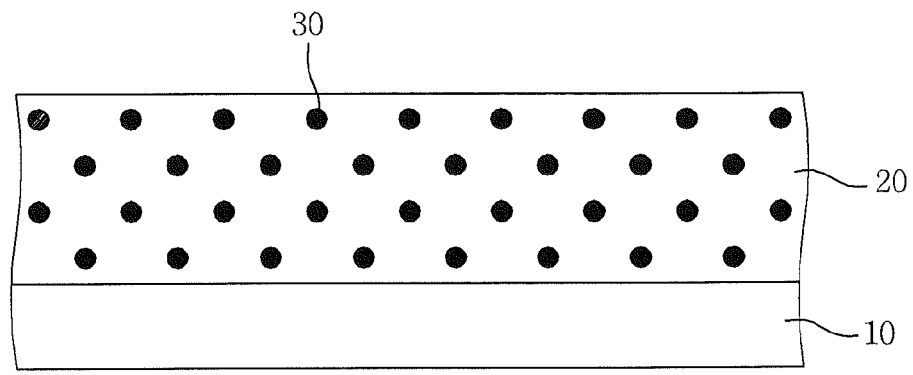
FIG. 11A to 11G are cross-sectional views illustrating a method of forming a porous and/or low-k dielectric layer according to the inventive concept.
Figure 11B:
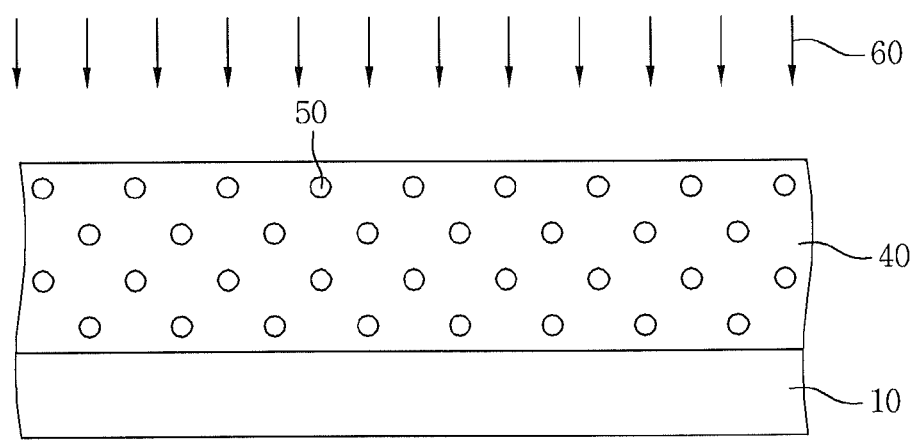

As shown in FIGS. 10 and 11A-11B, a porous and/or low-k dielectric layer 40 may be formed on a substrate 10 as described above with respect to FIGS. 1 and 2A-2B.

Figure 11C:
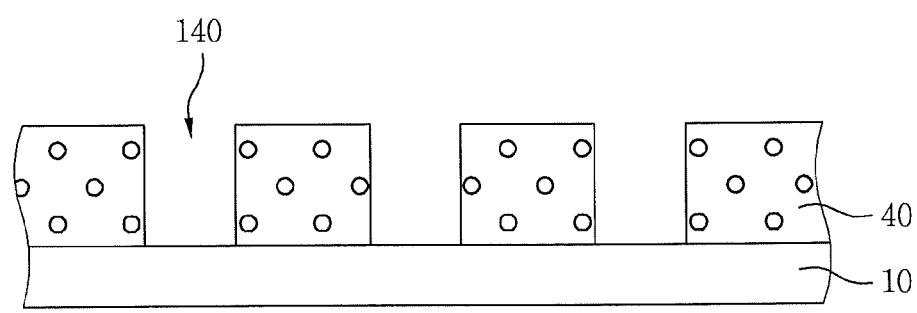

As shown in FIGS. 10 and 11C, the porous and/or low-k dielectric layer 40 may be etched (S3). For example, the porous and/or low-k dielectric layer 40 may be etched such that one or more openings 140 is formed therein, thereby exposing a portion of the underlying substrate 10. In some embodiments, openings 140 may be formed in the porous and/or low-k dielectric layer 40 in a predetermined pattern. For example, a photoresist layer (not shown) may be formed on the porous and/or low-k dielectric layer 40, and a photoresist pattern (not shown) may be formed therein (e.g., by exposure and development). The porous and/or low-k dielectric layer 40 may then be exposed to dry or wet etching through the photoresist pattern, and the photoresist pattern may be subsequently removed by ashing and/or strippng.

Figure 11D:
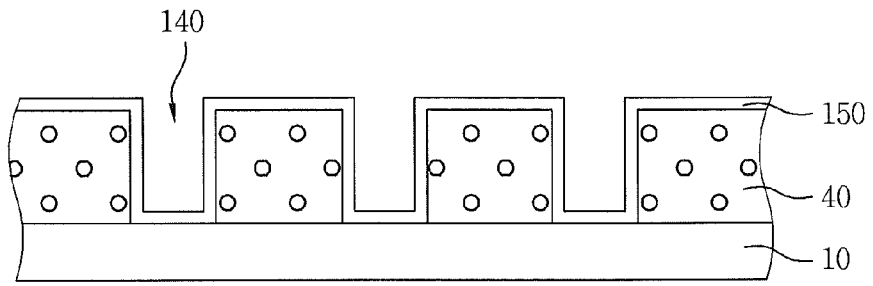

As shown in FIGS. 10 and 11D, a barrier layer 150 may be formed on the exposed surfaces of the substrate 10 and porous and/or low-k dielectric layer 40 (S4). For example, the barrier layer 150 may cover the exposed surface(s) of the substrate 10, the walls of the opening(s) 140 and/or the top surface of the porous and/or low-k dielectric layer 40. In some embodiments, the barrier layer 150 continuously covers the exposed surfaces of the substrate 10 and porous and/or low-k dielectric layer 40 (as shown in FIG. 11D).

The barrier layer 150 may comprise any suitable material, including, but not limited to, one or more of Ti, Ta, W and nitrides thereof.

The barrier layer 150 may be formed using any suitable method, including, but not limited to, CVD, sputtering, physical vapor deposition (PVD), atomic layer deposition (ALD), e-beam evaporation, electroless-chemical deposition and electrochemical deposition.

Figure 11E:
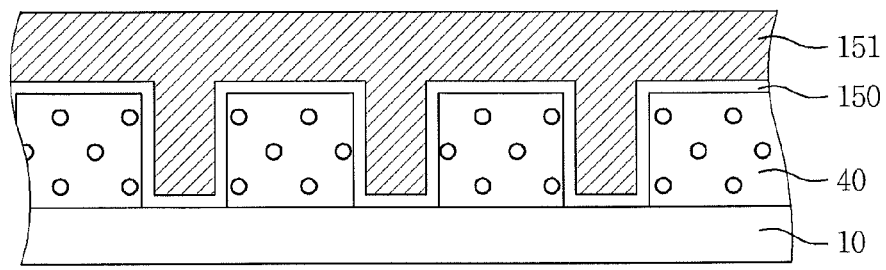

As shown in FIGS. 10 and 11E, a metal layer 151 may be formed on the barrier layer 150 (S5). For example, the metal layer 151 may be formed such that it fills the opening(s) 140 and/or covers the top surface of the barrier layer 150. In some embodiments, the metal layer 151 continuously fills the opening(s) and covers the top surface of the barrier layer 150 (as shown in FIG. 11E).

The metal layer 151 may comprise any suitable material, including, but not limited to, Al, W, Rh, Os, Ti, Ta, Pd, Pt, Mo, Cu, Cu alloys, metal silicides and combinations thereof.

The metal layer 151 may be formed using any suitable method. For example, a copper seed layer (not shown) may be formed on the barrier layer 150 and the metal layer 151 may be formed thereon by electroplating. Alternatively, the barrier layer 150 itself may be used as a seed layer for electroplating.

The barrier layer 150 may prevent diffusion of the metal layer 151 (or a component thereof) into the porous and/or low-k dielectric layer 40.

Figure 11F:
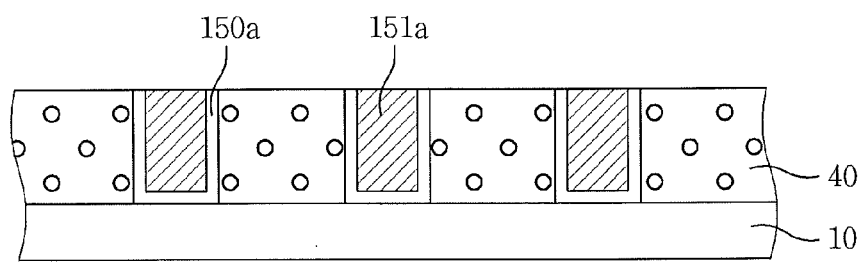

As shown in FIGS. 10 and 11F, one or more metal interconnections 151a and a barrier layer pattern 150a may be formed by planarizing the top surfaces of the porous and/or low-k dielectric layer 40, barrier layer 150 and metal layer 151 (S6). For example, any portion of the barrier layer 150 and/or metal layer 151 overlying the surface of the porous and/or low-k dielectric layer 40 may be removed such that the top surfaces of the porous and/or low-k dielectric layer 40, barrier layer 150 and metal layer 151 are planarized. Upon planarization, the metal interconnection(s) 151a may be electrically insulated by the porous and/or low-k dielectric layer 40.

Any suitable method may be used to planarize the top surfaces of the porous and/or low-k dielectric layer 40, barrier layer 150 and metal layer 151, including, but not limited to, chemical mechanical polishing (CMP) and etch-back processing. For example, the barrier layer 150 and metal layer 151 continuously cover the surface of the porous and/or low-k dielectric layer (as shown in FIG. 11E), and CMP may be performed using the porous and/or low-k dielectric layer 40 as a polishing stopper. The top surface of the porous and/or low-k dielectric layer 40 may thus be exposed and one or more metal interconnections 151a may be formed by planarizing the top surfaces of the barrier layer 150 and metal layer 151 with the top surface of the porous and/or low-k dielectric layer 40.

As shown in FIG. 10, metal oxides may be removed from the exposed surface(s) of the metal interconnection(s) 151a (S7). Metal oxides may form upon exposure of the metal interconnection(s) 151a to air, giving rise to hillocks which may interfere with subsequent capping steps and prevent the metal interconnection(s) from functioning properly and/or efficiently. The performance of the semiconductor device may therefore be improved by removing any such metal oxides.

Any suitable method may be used to remove metal oxides from the exposed surface(s) of the metal interconnection(s), including, but not limited to, exposing the metal oxides to plasma (e.g., plasma in an atmosphere of $NH_3$, $H_2$, He, $N_2$, Ar or a mixture thereof).

Figure 11G:
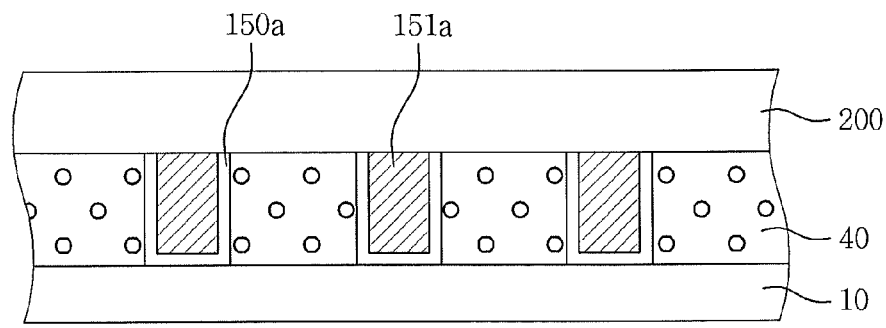

As shown in FIGS. 10 and 11G, a capping layer 200 may be formed on the exposed surfaces of the porous and/or low-k dielectric layer 40, barrier layer pattern 150a and metal interconnection(s) 151a (S8). For example, the capping layer 200 may be formed such that it prevents the flow of moisture or external ions into the porous and/or low-k dielectric layer 40 and/or diffusion of the metal layer 151 (or a component thereof) into the porous and/or low-k dielectric layer 40.

The capping layer 200 may comprise any suitable material, including, but not limited to, SiN, SiCN, BN and BCN. For example, the capping layer may comprise one or more SiN layers, SiCN layers, BN layers and/or BCN layers.

The capping layer 200 may be formed using any suitable method, including, but not limited to, CVD, sputtering, physical vapor deposition (PVD), atomic layer deposition (ALD), e-beam evaporation, electroless-chemical deposition and electrochemical deposition.

Alternatively, one or more metal interconnections 151a may be formed on the top surface of a porous and/or low-k dielectric layer 40 (i.e., directly on the top surface of a porous and/or low-k dielectric layer 40 or with one or more intervening layers (e.g., a barrier layer 150)). For example, a metal layer 151 may be formed on the surface of a porous and/or low-k dielectric layer 40 and one or more metal interconnections 151a may be formed by patterning the metal layer 151.

The metal layer 151 may comprise any suitable material, including, but not limited to, Al, W, Rh, Os, Ti, Ta, Pd, Pt, Mo, Cu, Cu alloys, metal silicides and combinations thereof.

The metal layer 151 may be formed using any suitable method. For example, a copper seed layer may be formed on an intervening layer (e.g., an intervening barrier layer 150) and the metal layer 151 may be formed thereon by electroplating. Alternatively, the porous and/or low-k dielectric layer 40 itself may be used as a seed layer for electroplating.

Moisture may be removed from the porous and/or low-k dielectric layer 40 using any suitable method, including, but not limited to, UV irradiation (e.g., using UV rays with a wavelength between about 260 and 450 nm).

Metal oxides may be removed from the exposed surface(s) of the metal interconnection(s) 151a as described above.

A capping layer 200 may be formed on the exposed surfaces of the porous and/or low-k dielectric layer 40, metal interconnection(s) 151a and/or any intervening layers (e.g., an intervening barrier layer 150). For example, a capping layer 200 may be formed such that is continuously covers the top surface of the porous and/or low-k dielectric layer 40, the sidewalls and top surface of each metal interconnection 151a and the sidewalls of any intervening layers (e.g., an intervening barrier layer 150). In some embodiments, the capping layer 200 is formed such that it prevents the flow of moisture or external ions into the porous and/or low-k dielectric layer 40 and/or diffusion of the metal layer 151 (or a component thereof) into the porous and/or low-k dielectric layer 40.

Semiconductor Devices

Porous and/or low-k dielectric materials and methods of the inventive concept may be used to form any suitable semiconductor device, including, but not limited to, single discrete devices and integrated circuit devices. For example, porous and/or low-k materials and methods of the inventive concept may be used to form a diode (e.g., a Gunn diode, an IMPATT diode, a laser diode, a light-emitting diode, a PIN diode, a Schottky diode, a Tunnel diode or a Zener diode), a photocell, a solar cell, a transistor (e.g., a bipolar transistor, a Darlington transistor, a field-effect transistor, an IGBT transistor or a unijunction transistor), a Hall effect sensor, an charge-coupled device, a microprocessor or a memory device (e.g., random access memory or read-only memory).

Electronic Systems

Semiconductor devices of the inventive concept may be incorporated into any suitable electronic system.

Figure 12:
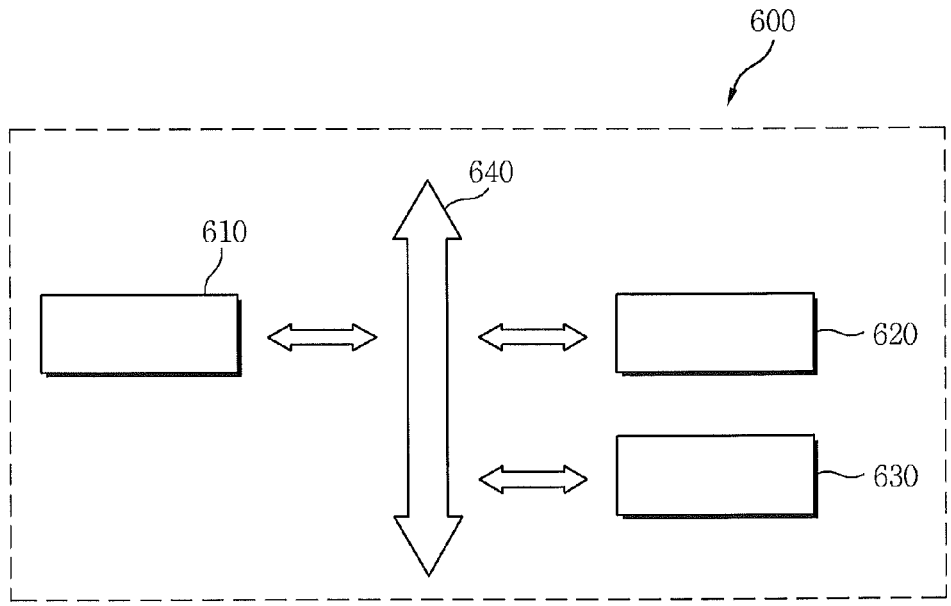
FIG. 12 is a schematic block diagram of an electronic system including an electronic apparatus according to exemplary embodiments of the inventive concept.

As shown in FIG. 12, an electronic system 600 may comprise a controller 610, an input/output device 630, a memory device 620, and a bus structure 640. The controller 610 and the memory device 620 may be combined to be a package on package (PoP). The controller 610 and/or the memory device 620 may comprise a semiconductor device of the inventive concept.

The bus structure 640 may serve to provide a path for transferring data between the controller 610, the input/output device 630, and the memory device 620.

The controller 610 may comprise at least one microprocessor, digital signal processor, or microcontroller and/or at least one logic device capable of performing a similar function thereto. The input/output device 630 may comprise a keypad, a keyboard and/or a display device. The memory device 620 may serve to store data and/or commands executed by the controller 610.

The memory device 620 may include a volatile memory chip such as a dynamic random access memory (DRAM) or a static random access memory (SRAM), a non-volatile memory chip such as a flash memory, a phase change memory, a magnetic random access memory (MRAM) or a resistance random access memory (RRAM), or a combination thereof.

Furthermore, a wired/wireless interface serving to transmit/receive data to/from a communication network may be provided. For example, the interface may include an antenna or a wired/wireless transceiver.

In the electronic system 600, an application chipset, and a camera image processor (CIS) may be further included.

The electronic system 600 may be realized as a mobile system, a personal computer, an industrial computer, or a logic system performing various functions. For example, the mobile system may be any one of a personal digital assistant (PDA), a smart phone, a portable computer, a web tablet, a mobile phone, a wireless phone, a laptop computer, a memory card, a digital music system, and a data transceiving system.

When the electronic system 600 is an apparatus for performing wireless communication, the electronic system 600 may be used in a communication system such as Code Division Multiple Access (CDMA), Global System for Mobile communication (GSM), North American Digital Cellular (NADC), Enhanced-Time Division Multiple Access (E-TDMA), Wideband. Code Division Multiple Access (WCDMA), or CDMA2000.

Figure 13:
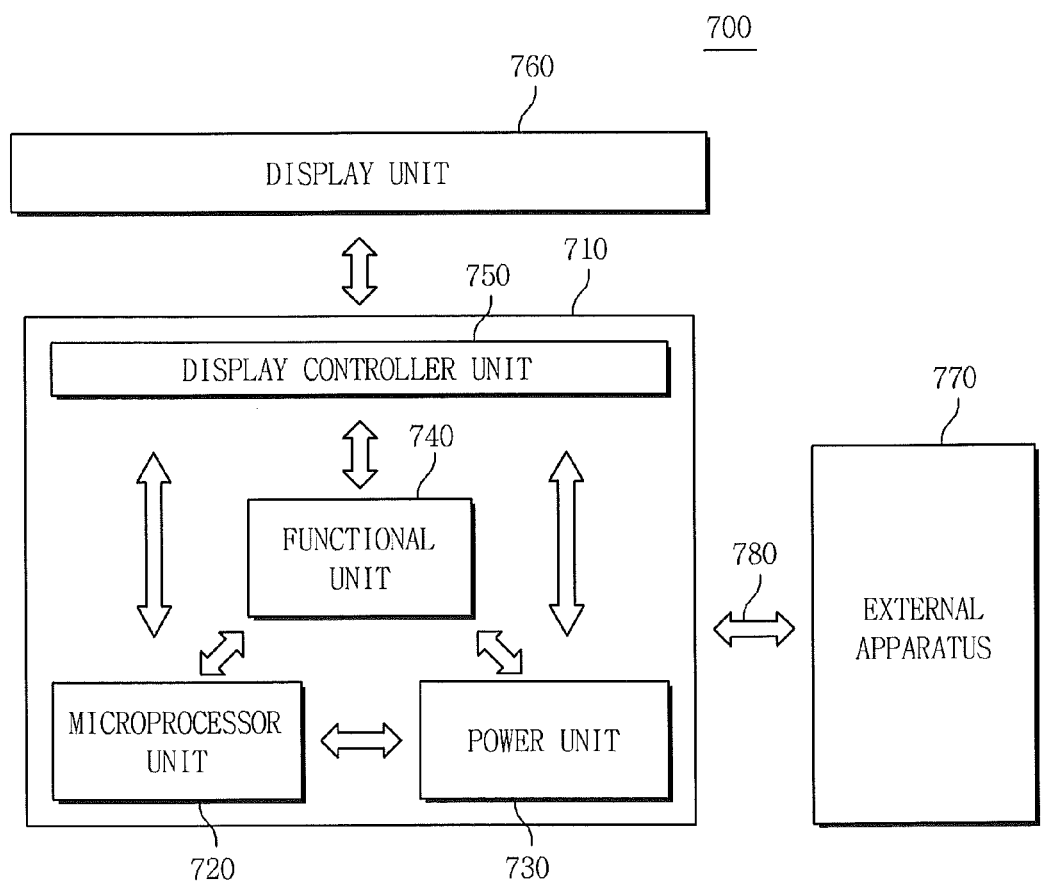
FIG. 13 is a block diagram of a system adopting a semiconductor device according to exemplary embodiments of the inventive concept.

As shown in FIG. 13, an electronic system 700 may comprise a body 710, a microprocessor unit 720, a power unit 730, a functional unit 740, and a display controller unit 750. The microprocessor unit 720 and/or the functional unit 740 may comprise a semiconductor device of the inventive concept.

The body 710 may comprise a mother board formed of a printed circuit board, and the microprocessor unit 720, power unit 730, functional unit 740, and display controller unit 750 may be installed in the body 710. A display unit 760 may be disposed inside or outside of the body 710. For example, the display unit 750 may be disposed on a surface of the body 710 to display an image processed by the display controller unit 750.

The power unit 730 may serve to distribute predetermined voltage, which is supplied from an external battery (not shown) and then branched according to a required level of voltage, to the microprocessor unit 720, the functional unit 740, and the display controller unit 750.

The microprocessor unit 720 may receive voltage from the power unit 730, and control the functional unit 740 and the display unit 760. The functional unit 740 may perform various functions of the electronic system 700. For example, when the electronic system 700 is a mobile phone, the functional unit 740 may include various components capable of performing a mobile function such as dialing, the output of an image to the display unit 760 and the output of a sound to a speaker by communication with an external apparatus 770, and when a camera is installed together within the electronic system 700, the functional unit 740 may serve as a camera image processor.

When the electronic system 700 is connected to a memory card in order to increase capacity, the functional unit 740 may be a memory card controller. The functional unit 740 may send and/or receive signals to and/or from the external apparatus 770 through a wired/wireless communication unit 780. Further, when the electronic system 700 requires a universal serial bus (USB) in order to expand its function, the functional unit 740 may serve as an interface controller.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of manufacturing a semiconductor device, comprising:

introducing an organosilicon precursor and at least one porogen into a chamber comprising a substrate and heating the substrate to a deposition temperature in a range of about 100° C. to less than about 245° C., thereby forming a porogen-containing dielectric layer on said substrate; and removing at least a portion of said at least one porogen from said porogen-containing dielectric layer to form a porous, low-k dielectric layer, wherein no oxidant is introduced into the chamber, wherein the chamber includes an electrode gap between an upper electrode and a lower electrode that is between 200 mm and 1000 mm, wherein said organosilicon precursor is represented by Chemical Formula 1

$$R_1R_2R_3\text{—}Si\text{—}(CH_2)_n\text{—}Si\text{—}R_4R_5R_6 \quad \text{Chemical Formula 1}$$

in which $R_1$, $R_2$, $R_3$, $R_4$, $R_5$ and $R_6$ each represent a hydrogen, a methyl group or an alkoxy group and n represents 1, 2, 3, 4 or 5, and wherein the ratio of bridging carbons to methyl groups in said porous, low-k dielectric layer is in a range of about 0.5:1 to about 3:1.

2. The method of claim 1, wherein said organosilicon precursor is represented by Chemical Formula 11

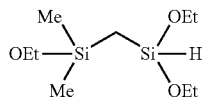

Chemical Formula 11 in which each OEt represents an ethoxy group.

3. The method of claim 2, wherein said substrate is heated to a deposition temperature of about 220° C.

4. The method of claim 3, wherein said at least one porogen comprises α-terpinene.

5. The method of claim 1, wherein said porous, low-k dielectric layer comprises an Si—O—Si network with an Si—O—Si backbone and a carbon bridge structure (Si—(CH$_2$)—Si—).

* * * * *